(12) United States Patent
Schmidt et al.

(10) Patent No.: US 7,138,333 B2
(45) Date of Patent: Nov. 21, 2006

(54) PROCESS FOR SEALING PLASMA-DAMAGED, POROUS LOW-K MATERIALS

(75) Inventors: Michael Schmidt, Dresden (DE); Georg Tempel, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/934,114

(22) Filed: Sep. 3, 2004

(65) Prior Publication Data

US 2005/0095828 A1  May 5, 2005

(30) Foreign Application Priority Data

Sep. 5, 2003 (DE) ................ 103 41 398
Nov. 28, 2003 (DE) ................ 103 56 360

(51) Int. Cl.
*H01L 21/4763* (2006.01)
(52) U.S. Cl. .............. 438/627; 438/778; 438/789
(58) Field of Classification Search .......... 438/762, 438/618, 627, 758, 778, 789, 790
See application file for complete search history.

(56) References Cited

U.S. PATENT DOCUMENTS 6,764,809 B1 * 7/2004 DeSimone et al. ......... 430/313
6,919,636 B1 * 7/2005 Ryan .......................... 257/751
2001/0051420 A1  12/2001 Besser et al.
2003/0198895 A1 * 10/2003 Toma et al. ................ 430/314
2005/0077597 A1 * 4/2005 Toma et al. ................ 257/629

FOREIGN PATENT DOCUMENTS

WO  WO 01/54190 A1  7/2001
WO  WO 2004/000960 A1  12/2003

* cited by examiner

*Primary Examiner*—Brook Kebede
(74) *Attorney, Agent, or Firm*—Slater & Matsil, L.L.P.

(57) ABSTRACT

The invention relates to a process for sealing plasma-damaged, porous low-k materials on Si substrates, in which self-aligning molecules (SAMs) are applied to the low-k material, and then a diffusion barrier is applied to the low-k material. The invention is based on the object of providing a process for sealing plasma-damaged, porous low-k materials on Si substrates, which allows an improved distribution of the SAMs to be achieved, in particular in the case of structures with a high aspect ratio, and which allows the low-k materials to be repaired, dewatered and sealed. According to the invention, this is achieved by virtue of the fact that the deposition of the SAMs is carried out using a supercritical $CO_2$ process ($scCO_2$ process), by the wafers being introduced into a process chamber, that $CO_2$ and SAMs are introduced into the process chamber and the process chamber is pressurized, that the wafers are heated to a temperature of over 35° C. up to 300° C., and that the ambient conditions in the process chamber are maintained for a predetermined period of time.

14 Claims, 4 Drawing Sheets

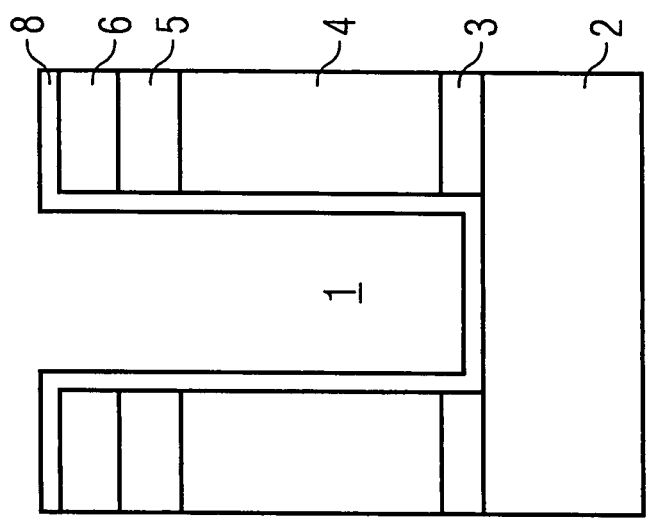
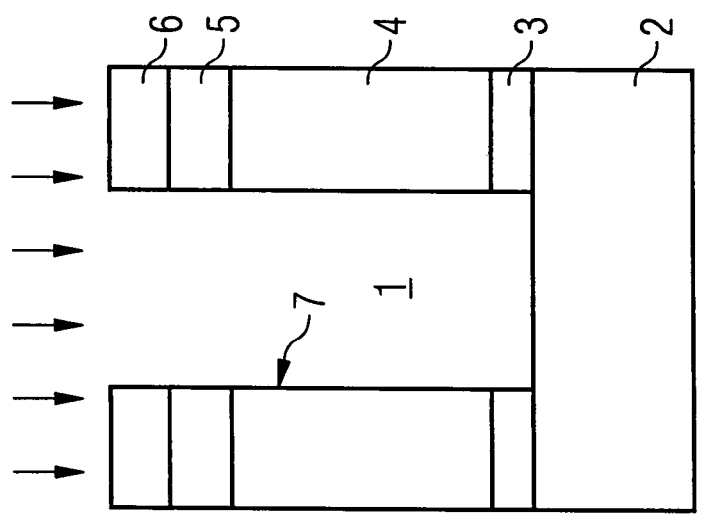
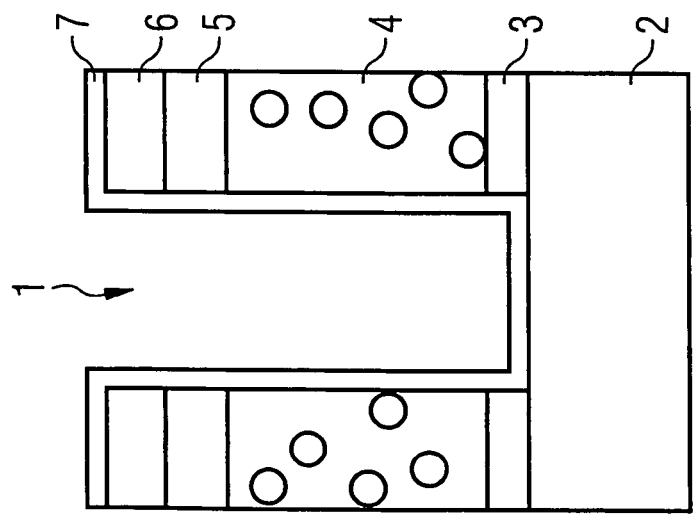

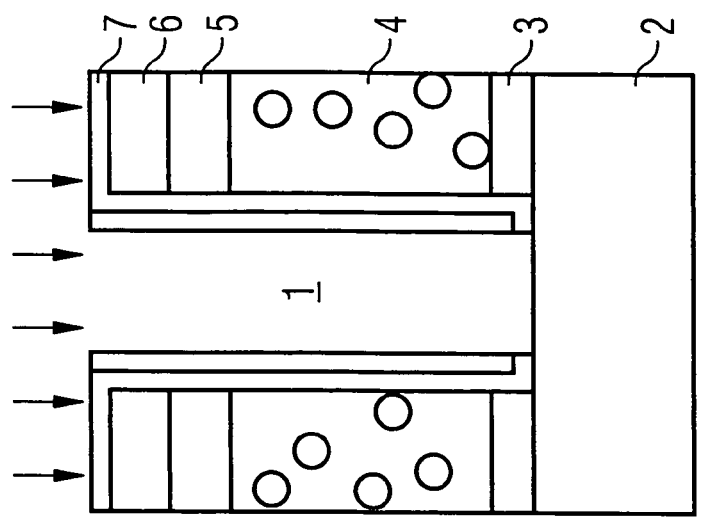
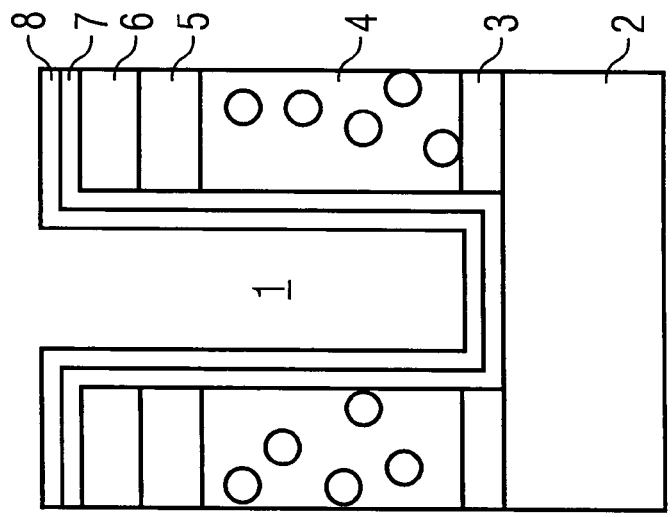
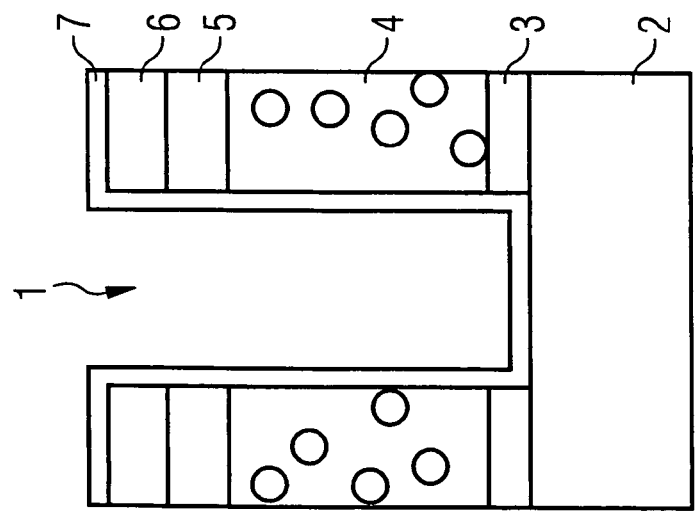

(I)

(II)

(III)

(IV)

PROCESS FOR SEALING PLASMA-DAMAGED, POROUS LOW-K MATERIALS

This application claims priority to German Patent Application 103 41 398.7, which was filed Sep. 5, 2003, and to German Patent Application 103 56 360.1, which was filed Nov. 28, 2003, both of which applications are incorporated herein by reference.

TECHNICAL FIELD

The invention relates to a process for sealing plasma-damaged, porous low-k materials on Si substrates (wafers), in which self-aligning molecules (SAMs) are applied to the low-k material, and then a diffusion barrier is applied to the low-k material.

BACKGROUND

In copper (Cu) Damascene processes, metal tracks and contacts are lined with a Cu diffusion barrier prior to the metalization in the BEOL (Back End of Line process).

Porous low-k materials (LK materials) are increasingly also being integrated as ILDs (Interlayer Dielectrics) instead of silicon dioxide. In the event of plasma etching into these materials, the pores at the sidewalls of the etched recesses are partially uncovered, so that when the diffusion barrier is being applied, typically by means of PVD or the like, discontinuities may form in the diffusion barrier as a result of large pores. To fill these pores, the sidewalls can be wetted by means of self-aligned molecules (SAMs), and then the diffusion barrier can be deposited.

Examples of low-k materials of this type include carbon-doped silicon dioxide, other silicon-containing materials and carbon-containing compounds. Exceptions in this context include, for example, SiLK™ (LK: low-k material with a low dielectric constant) and porous p-SiLK™ and fluorinated hydrocarbons.

These materials are applied to the substrate as separating layers between the metallization levels during chip production, after which recesses are then etched into this material. These recesses are ultimately filled with a metal, generally copper, so that metal interconnects (metal trenches) are formed. The metalization levels are also connected to one another by contacts, by particularly deep vias being etched through the ILD as far as the next metallization level down, these vias then likewise are filled with a metal. This process is also known as the dual Damascene process.

In the case of the low-k materials, recesses are formed in the surface of the trenches or vias during the plasma etching, and at the same time large pores in the low-k material may also be uncovered. It is also possible for individual pores to become connected to one another during further processing steps, such as etching, so as to form even larger cavities.

In particular the pores close to surfaces are exposed to various chemical substances, such as water, water vapor or the like, during chip production, and may form even larger cavities as a result of individual pores being linked to one another through channels. As a result, the dielectric properties of the ILDs are adversely affected or even completely destroyed.

To prevent this, it is necessary for the pores to be sealed with a suitable material. In principle, the sealing can be effected using a CVD liner, on which a diffusion barrier is then deposited. However, the CVD process may cause the same "defects" as those described above.

A similar process is described in WO 01/54190 A1 (corresponding U.S. Patent Publication No. 2001/0051420 A1). However, as the scale of integration increases further, this process is reaching its limits, i.e., on account of the cumulatively considerable layer thicknesses of over 25 nm, it cannot be employed in narrow trenches.

Another possible way of sealing the large pores consists in using the above-described SAMs, which are provided with functional groups which on the one hand have an affinity for Si atoms (in the case of methyl-silsesquioxane materials (MSQ materials)) and on the other hand have a preferential affinity for metal atoms (e.g., barrier metals, also copper) (DE 102 27 663.3-14). Furthermore, the functional group, which is to be bonded to the metal, has the property of preventing oxidation of the metal, in this case copper. This makes it possible to prevent the formation of ions, which may be accelerated in the electric field, which can lead to leakage currents between adjacent metal tracks.

In this case, the SAMs are applied by means of dip coating or a spin-on process.

SUMMARY OF THE INVENTION

Aspects of the invention provide a process for sealing plasma-damaged, porous low-k materials on Si substrates. This preferred method allows an improved distribution of the SAMs to be achieved in particular in the case of structures with a high aspect ratio, and which allows the low-k materials to be repaired, dewatered and sealed.

In the preferred embodiment, the deposition of the SAMs is carried out using a supercritical $CO_2$ process (sc$CO_2$ process). Wafers are introduced into a process chamber and $CO_2$ and SAMs are introduced into the process chamber and the process chamber is evacuated. The wafers are heated to a temperature of over 35° C. (at 75 bar), and the ambient conditions in the process chamber are maintained for a predetermined period of time.

An advantage of this is that the low-k repair in this case functions by the incorporation of chemically functional groups, such as methyl, e.g., HMDS (hexamethyldisilazane); hexamethyldisilanes or ZMCS (trimethylchlorosilanes). In this context, methyl is incorporated and polar OH groups are exchanged.

The process chamber is in this case pressurized to 100–300 bar, and the temperature of the wafer is controlled from approx. 60° C. to approx. 300° C.

In a further configuration of the invention, the predetermined period of time for the deposition of the SAMs (polymer) in the process chamber is 0.5–10 min.

To achieve complete layer occupancy of the SAMs, in a further refinement of the invention it is provided for the cycle in the process chamber to be repeated one or more times (multiple deposition).

Furthermore, it is provided that a barrier layer is applied following the deposition of SAMs (polymer), a Cu seed layer is applied to the barrier layer, and last of all Cu is deposited.

In a further configuration of the invention, there is provision for the barrier layer, the Cu seed layer and the Cu layer to be deposited in a cluster tool immediately after the SAMs deposition.

The SAMs (polymer) preferably contain functional groups A and B, functional group A having a preferential affinity for Si and functional group B having a particular affinity for Cu, with the functional group B being oriented on the metal during the barrier or Cu seed layer deposition. The functional group B makes it possible to prevent the oxidation of Cu.

Advantages of the process according to embodiments of the invention for sealing plasma-damaged, porous low-k materials are considered to reside in the fact that the applied polymer fills up only the outermost pores in the sidewall (trench) and does not penetrate into the interconnecting structures of the pores. Furthermore, the polymer has a good thermal stability and consequently is able to withstand subsequent process steps, such as low-k drying, ALD, etc., at typical process temperatures of 400° C.

A further advantage is that the polymer has a coefficient of thermal expansion, which is comparable to that of the low-k layer and the barrier layer.

Further advantages include good adhesion for the low-k material; no detrimental drop in the adhesion for the barrier layer; no disadvantageous effects on the k value of the ILD (Inter-Level Dielectric); high selectivity during the dry-etching of the hard mask (HM), e.g., SiC, and no escape into the scCO$_2$ chamber.

BRIEF DESCRIPTION OF THE DRAWINGS

The invention is to be explained in more detail below on the basis of exemplary embodiments. In the associated drawings:

FIG. 3 shows one possible way of integrating the process according to the invention in semiconductor fabrication;

FIG. 3a shows a cross-section from part of the wafer structure having a copper layer (metalization) on a substrate (not shown), a protective layer situated above the copper layer, a low-k layer (inter-dielectric) which includes pores, is situated on the protective layer and is covered by an etching stop layer and a silicon dioxide layer, the walls and base of the etching trench being coated with a polymer layer according to the invention;

FIG. 3b shows the arrangement shown in FIG. 3a after an etching step has been carried out, for example in an O$_2$ plasma, in which step the polymer layer has been removed again but the pores remain filled with the polymer;

FIG. 3c shows the arrangement illustrated in FIG. 3b following the application of a barrier layer, e.g. Ta/TaN;

FIG. 4 shows a further possible way of integrating the process according to the invention in semiconductor fabrication;

FIG. 4a shows an arrangement corresponding to FIG. 3a;

FIG. 4b shows the arrangement illustrated in FIG. 4a, in which the etching trench has additionally been provided with the thinnest possible lining of, for example, Ta/TaN;

FIG. 4c shows the arrangement shown in FIG. 4b after an etching step in which the base of the etching trench is removed and the copper layer beneath it is uncovered.

DETAILED DESCRIPTION OF ILLUSTRATIVE EMBODIMENTS

Figure 1:
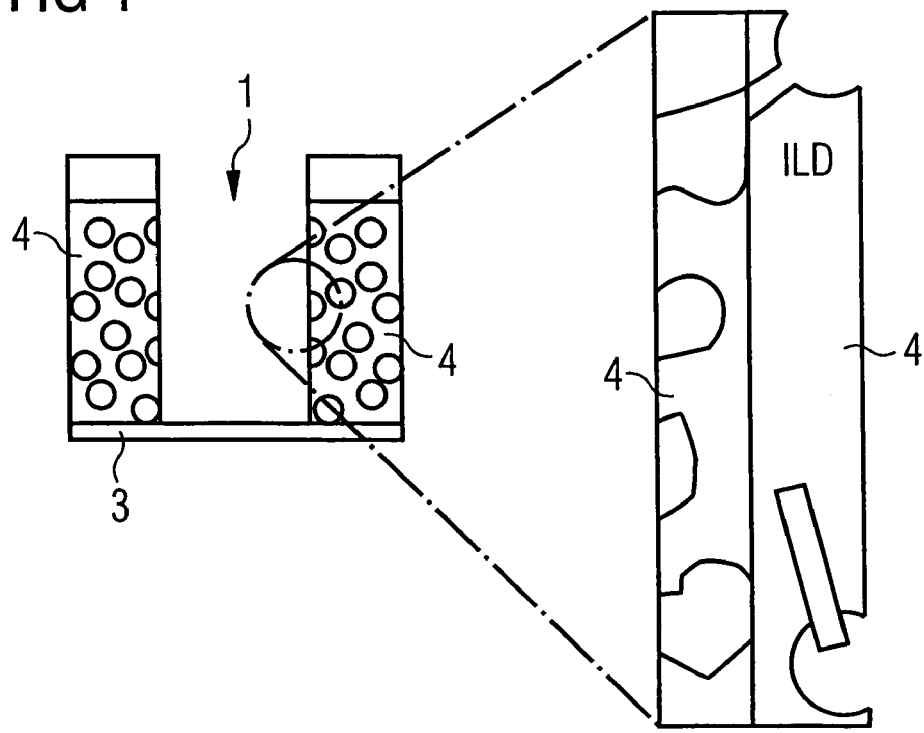
FIG. 1 shows a cross-section through the top side of a wafer with a recess (trench/via) which has been etched into an inter-dielectric layer (porous low-k material) and has pores in it, and an enlarged illustration of an excerpt in which individual pores are connected to one another by channels.

The process according to the invention allows the sealing of pores in porous materials, in particular for sealing pores in sidewalls of vias or trenches, which have been etched into the porous materials (dielectric low-k materials). These pores in the porous materials are uncovered during the etching of trenches or vias, i.e., the porous materials are damaged, so that materials which detrimentally alter the dielectric properties of the dielectric can penetrate into the pores during subsequent processing steps (FIG. 1).

Figure 2:
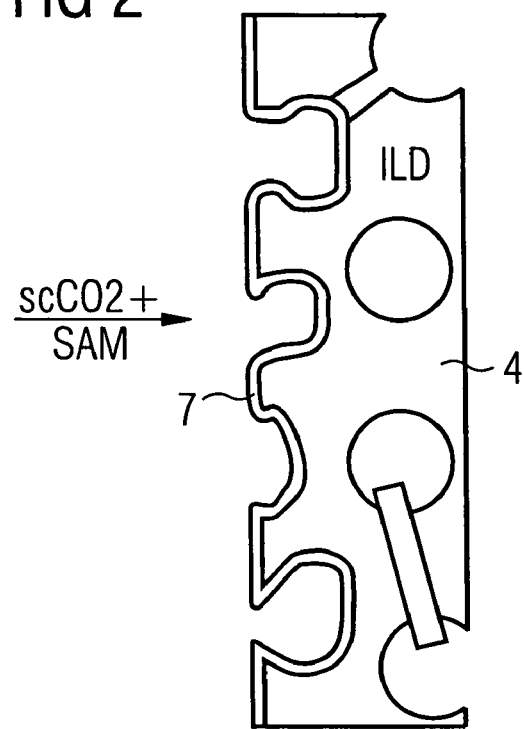
FIG. 2 shows a cross-section through the sidewall of the low-k material following the repair after the uniform deposition of the SAMs and the sealing of the pores.
Figure 5A:
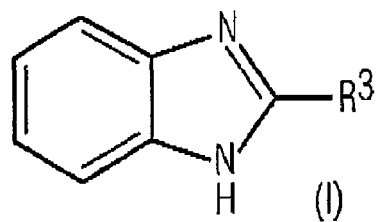
FIGS. 5a, 5b, 5c, and 5d show group B functional structures of compounds.
Figure 5B:
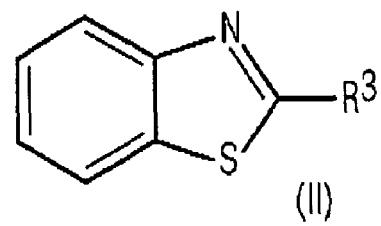
Figure 5C:
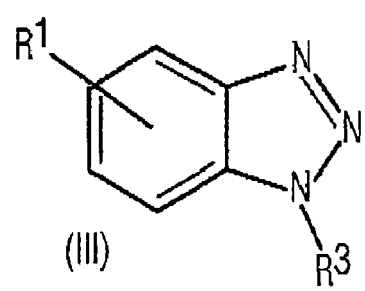
Figure 5D:
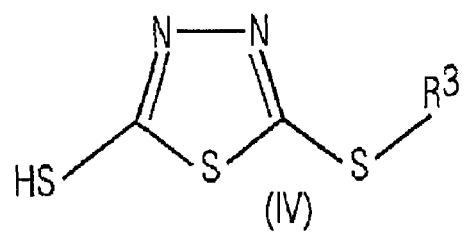

Examples of low-k materials which are suitable for consideration include silicon-containing materials, such as carbon-doped SiO$_2$, silsesquioxanes, such as hydrogen silsesquioxanes (HSQ) or methylsilsesquioxanes (MSQ), and further materials, such as those mentioned in DE 102 27 663.3 and counterpart application publication WO 2004/000960 "Process for sealing porous materials during chip production, and compounds for this process". These German and PCT applications are incorporated herein by reference The pores close to the surfaces in the trenches/vias are sealed using a polymer, which, for example, include the functional groups A and B. It is possible for the functional group A to bond to silicon-containing materials and/or metal nitrides, or to have a particular affinity for these materials, and for the functional group B to be bonded to copper, copper(I) oxide and/or copper(II) oxide or to have a particular affinity for copper (FIG. 2). A so-called self-aligning polymer of this type is described in DE 102 27 663.3 and corresponding PCT application WO 2004/000960 A1. More specifically, as discussed in the PCT application, the functional group A portion of the polymer compound can bind to materials containing silicon and/or metal nitrides and having a structure comprising $(R^2—O—)_{3-n}SiR^1_n—R^3$ where n=1 or 2, $R^1$ and $R^2$ are respectively an alkyl or aryl group and can be identical or different. $R^3$ is an alkene or an arylene group. The functional group B can bind to metal copper, copper (I) oxide and/or copper (II) oxide and defines one or more of the structures I, II, III, or IV shown in FIGS. 5a, 5b, 5c, and 5d wherein $R^1$ and $R^3$ are the same as the $R^1$ and $R^3$ discussed above with respect to group A. The two groups A and B are connected to the polymer main chain by $R^3$.

To achieve a distribution on the surface, which is improved compared to the process of applying the SAMs by dip coating or spin-on processes as described in DE 102 27 663.3, the invention now uses a "supercritical CO$_2$ process" as the deposition process.

For this purpose, a process chamber which is filled with CO$_2$ and in which the wafers to be treated are arranged is pressurized to 150–300 bar, and the wafers are heated to over approx. 60° C. Then, CO$_2$ and SAMs are introduced into the process chamber and the above-mentioned settings are maintained for approx. 0.5 to 10 min. This cycle can be repeated until the desired layer thickness or complete layer coverage of the SAMs has been achieved. Prior to the introduction of the SAMs into the process chamber, it is also possible, if desired, for the low-k material to be "repaired," for example, by means of hexamethyldisilazanes (HMDS).

Then, a barrier layer, for example of Ta/TaN, or a Cu seed layer can be applied, so that the trenches/vias can then be filled with copper.

FIGS. 3a–3c and 4a–4c show a number of process variants allowing the sealing according to embodiments of the invention to be integrated in semiconductor fabrication.

FIG. 3a shows a cross-section from part of the wafer structure, with a metalization layer 2 (e.g., copper) on a substrate (not shown) and a protective layer 3 located above the copper layer 2. A low-k layer 4 (inter-dielectric) is located on the protective layer 3 and includes pores. The layer 4 is covered by an etching stop layer 5 and a silicon dioxide layer 6. Furthermore, FIG. 3a shows a trench/via 1 which has been produced by means of standard etching processes and the walls and base of which have been coated with the polymer layer 7 according to the invention. The polymer layer 7 comprised of the two functional groups of self-aligned molecules SAMs closes up the pores in the low-k layer 4 which are close to the surface.

After the polymer layer 7 has been applied, it is removed again, with the exception of the pores in the sidewalls of the trench/via 1 that have been filled with the polymer 7, as shown in FIG. 3b. This etching step can be carried out, for example, by means of anisotropic dry etching in an $O_2$ plasma. This can be followed by lining of the inner walls of the trench/via 1 with a barrier layer 8, e.g., Ta/TaN, e.g., using an ALD process, as shown in FIG. 3c.

Filling of the pores close to the surface with the polymer layer 7 allows the barrier layer 8 to be made significantly thinner, thereby allowing process time to be saved.

Then, the trench/via 1 can be filled with metal, e.g., copper, in order, for example, to produce a contact to the copper layer 2.

FIG. 4a illustrates an arrangement corresponding to FIG. 3a. FIG. 4b shows an arrangement in which, in addition, the etched trench has been provided with as thin a lining as possible of a barrier layer 8, e.g., Ta/TaN. In a subsequent etching step, only the upper barrier layer 8 and the barrier layer 8 located at the base of the trench 1, as well as the polymer layer 7 beneath it and the protective layer 3, are etched away (FIG. 4c). As a result, the copper layer 2 is uncovered and is electrically contact-connected when the trench/via 1 is filled with a metal, e.g., copper.

What is claimed is:

1. A process for forming a semiconductor device, the process comprising:
   providing a semiconductor substrate;
   forming a layer of low-k material over the semiconductor substrate;
   performing a supercritical $CO_2$ process to deposit a polymer layer of self-aligning molecules (SAMs) on the low-k material, said polymer layer comprising functional groups A and B, wherein functional group A has a preferential affinity for silicon and functional group B has a preferential affinity for copper, the supercritical $CO_2$ process including introducing $CO_2$ and the SAMs comprising group A and group B into a process chamber that includes the semiconductor substrate, pressurizing the process chamber, and heating tile semiconductor substrate to a temperature of over 35° C.; and
   forming a diffusion barrier over the low-k material.

2. The process as claimed in claim 1, wherein pressurizing the process chamber comprises pressurizing to 100–300 bar.

3. The process as claimed in claim 1, wherein heating the semiconductor substrate comprises heating the semiconductor substrate to around 35–200° C.

4. The process as claimed in claim 1, wherein ambient conditions for the deposition of the SAMs in the process chamber are maintained for a period of time of about 0.5 to 10 minutes.

5. The process as claimed in claim 1, wherein performing a supercritical $CO_2$ process comprises performing a cycle in the process chamber and repeating the cycle one or more times.

6. The process as claimed in claim 1, further comprising removing at least a portion of the polymer layer prior to forming the barrier layer.

7. The process as claimed in claim 1, wherein forming the diffusion barrier over the low-k material comprises forming the diffusion barrier over the polymer layer.

8. The process as claimed in claim 1, and further comprising forming a copper seed layer over the diffusion barrier and depositing a copper layer over the copper seed layer.

9. The process as claimed in claim 8, wherein the diffusion barrier comprises Ta.

10. The process as claimed in claim 8, wherein the barrier layer, the copper seed layer and the copper layer are carried out in a cluster tool immediately after the polymer layer deposition.

11. The process as claimed in claim 1, wherein functional group B is oriented on a metal during deposition of the barrier layer or a Cu seed layer.

12. The process as claimed in claim 1, wherein the low-k material layer comprises at least one material selected from the group consisting of carbon-doped $SiO_2$ and a silsesquioxane.

13. The process as claimed in claim 1, wherein the low-k material layer comprises at least one material selected from the group consisting of hydrogen silsesquioxane (HSQ) or methylsilsesquioxane (MSQ).

14. A process for sealing a plasma-damaged, porous low-k material over a silicon wafer, in which a functional group A of self aligning molecules (SAMs) having a preferential affinity for silicon and a functional group B of self-aligning molecules (SAMs) having a preferential affinity for copper are applied to the low-k material, and then a diffusion barrier is applied to the low-k material, wherein deposition of the SAMs is carried out using a supercritical $CO_2$ process, where the wafer is introduced into a process chamber, wherein $CO_2$ and SAMs are introduced into the process chamber and the process chamber is pressurized, wherein the wafers are heated to a temperature of over 35° C. at over 75 bar, and wherein the ambient conditions in the process chamber are maintained for a predetermined period of time.

* * * * *

UNITED STATES PATENT AND TRADEMARK OFFICE
CERTIFICATE OF CORRECTION

PATENT NO. : 7,138,333 B2  Page 1 of 1
APPLICATION NO. : 10/934114
DATED : November 21, 2006
INVENTOR(S) : Schmidt et al.

It is certified that error appears in the above-identified patent and that said Letters Patent is hereby corrected as shown below:

Title Page
In (56) references cited; insert --(DE 102 27 663 A1 1/2004)--

Signed and Sealed this

Sixth Day of February, 2007

JON W. DUDAS
*Director of the United States Patent and Trademark Office*